(12) United States Patent
Kobayashi

(10) Patent No.: US 7,619,482 B1
(45) Date of Patent: Nov. 17, 2009

(54) COMPACT LOW VOLTAGE LOW NOISE AMPLIFIER

(75) Inventor: Kevin W. Kobayashi, Torrance, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 45 days.

(21) Appl. No.: 11/685,248

(22) Filed: Mar. 13, 2007

(51) Int. Cl.
*H03F 3/04* (2006.01)

(52) U.S. Cl. ...................................... 330/311; 330/310
(58) Field of Classification Search .................. 330/98, 330/150, 310, 311
See application file for complete search history.

(56) References Cited

U.S. PATENT DOCUMENTS

| | | | | |
|---|---|---|---|---|
| 4,236,120 | A | * | 11/1980 | White ........................ 330/296 |
| 4,393,355 | A | * | 7/1983 | Davis et al. ................. 330/294 |
| 4,801,893 | A | * | 1/1989 | Perandi ....................... 330/300 |
| 4,845,386 | A | | 7/1989 | Ueno .......................... 326/110 |
| 5,128,741 | A | | 7/1992 | Arnborg ...................... 257/351 |
| 5,177,449 | A | * | 1/1993 | Asazawa ..................... 330/252 |
| 5,250,826 | A | | 10/1993 | Chang et al. ................ 257/273 |
| 5,398,004 | A | * | 3/1995 | Kobayashi ................... 330/293 |
| 5,493,251 | A | | 2/1996 | Khambaty et al. ........... 327/564 |
| 5,838,031 | A | | 11/1998 | Kobayashi et al. .......... 257/197 |
| 6,465,289 | B1 | | 10/2002 | Streit et al. ................. 438/167 |
| 6,906,359 | B2 | | 6/2005 | Zampardi et al. ........... 257/197 |
| 7,015,519 | B2 | | 3/2006 | Krutko et al. ............... 257/197 |
| 7,071,781 | B2 | * | 7/2006 | Everton et al. .............. 330/261 |

OTHER PUBLICATIONS

Horowitz, Paul et al., "The Art of Electronics", 2nd Edition, Cambridge University Press, 1989, pp. 134, 181.
Feucht, Dennis L., "Handbook of Analog Circuit Design", Academic Press, 1990, pp. 91, 347-348, 583-584.
Grebene, Alan B., "Bipolar and MOS Analog Integrated Circuit Design", Wiley Interscience, 1984, pp. 386-387.
Larson, Lawrence E., "RF and Microwave Circuit Design for Wireless Communications", Artech House Publishers, 1996, pp. 361-363.
Advanced Linear Devices, products ALD110802/ALD110902, 2005.

* cited by examiner

*Primary Examiner*—Henry K Choe
(74) *Attorney, Agent, or Firm*—Withrow & Terranova, P.L.L.C.

(57) ABSTRACT

An apparatus comprising a first stage and a second stage. The first stage generally comprises a first transistor configured as a common-emitter amplifier. The second stage generally comprises a second and third transistor configured as a low voltage Darlington transistor pair. The first stage may be directly coupled to the second stage. The second transistor generally comprises a field effect (FET) input transistor. The third transistor generally comprises a bipolar output transistor. In one example, the apparatus may comprise a 2-stage RF amplifier operating from DC to microwave frequencies.

21 Claims, 7 Drawing Sheets

COMPACT LOW VOLTAGE LOW NOISE AMPLIFIER

FIELD OF THE INVENTION

The present invention relates to amplifiers generally and, more particularly, to a method and/or apparatus for implementing a compact low voltage low noise multistage amplifier.

BACKGROUND OF THE INVENTION

Low voltage Global Positioning System (GPS) Low Noise Amplifiers (LNAs) operate with a supply voltage of 1.8V or less. Such amplifiers are needed for many modern portable applications.

Conventional Darlington amplifiers are noted for their wide band frequency performance, compact size, and ease of integration. Directly coupling a common-emitter amplifier with a Darlington amplifier can increase the gain and lower noise of the Darlington amplifier over a broadband. Such an implementation can be useful for multi-band wireless applications. The use of bipolar transistors to implement a Darlington uses a supply of at least 2-2.5 times the base to emitter voltage (Vbe), which would exceed the supply voltage available for low voltage portable applications. While bipolar transistors offer higher gain, lower noise, and better linearity compared to MOSFET transistors, bipolar transistors typically need more headroom voltage to operate in a radio frequency range.

It would be desirable to use a zero voltage-threshold FET device to create a low voltage Darlington that runs with a low operating voltage provides a compact 2-stage direct-coupled low noise amplifier, provides power down capability, and maintains radio frequency performance comparable to a bipolar implementation.

SUMMARY OF THE INVENTION

The present invention concerns an apparatus comprising a first stage and a second stage. The first stage generally comprises a first transistor configured as a common-emitter amplifier. The second stage generally comprises a second transistor and a third transistor configured as a low voltage Darlington transistor pair. The first stage may be directly coupled to the second stage. The second transistor generally comprises a field effect (FET) input transistor. The third transistor generally comprises a bipolar output transistor. In one example, the apparatus may comprise a 2-stage radio frequency amplifier operating from DC to microwave frequencies.

The objects, features and advantages of the present invention include providing an amplifier that may (i) reduce the operating voltage of a Darlington configuration that is directly coupled to a low noise common-emitter input amplifier, (ii) provide wideband low noise radio frequency performance under low supply operation (iii) combine a zero or near zero-threshold (Vt) NMOS input transistor with a bipolar output transistor to implement a low voltage Darlington pair, (iv) directly couple a common-emitter low noise feedback input stage with a low voltage Darlington to implement a compact, low voltage direct-coupled two-stage amplifier with high gain and low noise characteristics while operating over a multi-decade bandwidth, (v) implement a depletion mode FET device for an input transistor of the Darlington with a bipolar output stage, (vi) implement a Darlington that is directly coupled to a FET common-source input stage to further reduce the supply operation, and/or (vii) implement a FET feedback device for low power down capability.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
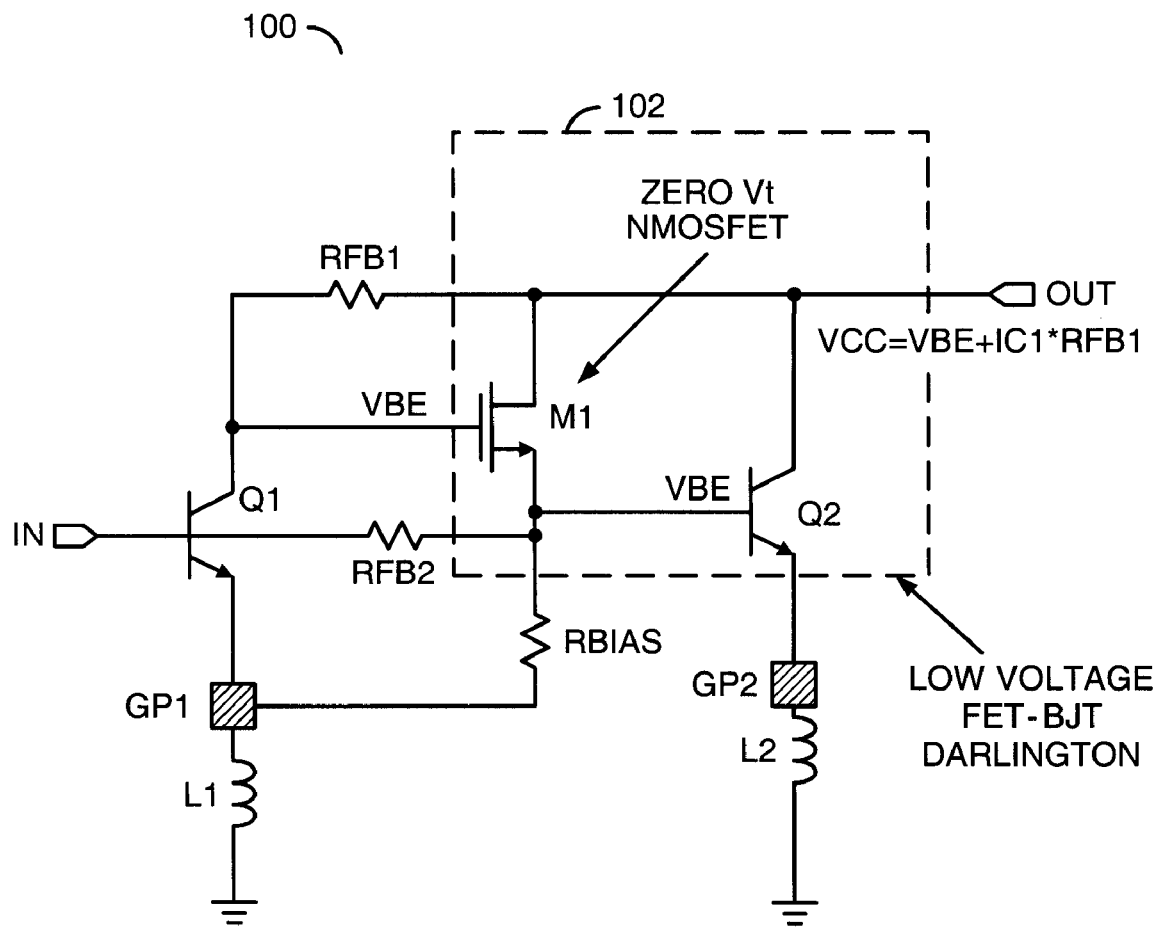
FIG. 1 is a diagram of an implementation of the present invention.

Referring to FIG. 1, a block diagram of a circuit 100 is shown in accordance with a preferred embodiment of the present invention. The present invention may implement a Zero-threshold MOSFET with a bipolar transistor to form a low voltage Darlington. The Darlington may be directly coupled to a low noise common-emitter input stage. The circuit 100 provides multi-decade low noise figure and high gain characteristics of bipolar design while operating under low supply voltages compatible with CMOS design.

The present invention may provide a low voltage direct-coupled amplifier invention that may be used in applications such as (1) low voltage, wideband or ultra wideboard (UWB) amplifiers, (2) 1.8V external high gain, low noise figure global positioning system (GPS) low noise amplifier (LNA), (3) low voltage general purpose standard product high gain-broadband buffer amplifiers for wireless portables, and/or (4) low DC power, DC-microwave amplifiers using state-of-the-art BiCMOS technology for fiber, instrumentation, millimeter-wave radio.

The circuit 100 generally comprises a first stage that generally comprises a transistor (e.g., Q1) and a second stage 102. The transistor Q1 may be implemented as a low noise transistor configured as a common-emitter amplifier. For example, the transistor Q1 may be implemented as a common-emitter bipolar transistor having a noise matching source inductor (e.g., L1). The source inductor L1 may be implemented as a ground bond inductor that has a first side bonded to a pad (e.g., GP1) of and integrated circuit (not shown). A second side of the inductor L1 may be bonded to a common ground. The inductor L1 may be used to provide an optimum noise match (e.g., 50 Ohm) across a broad or narrow bandwidth.

The transistor Q1 is normally directly coupled to the second stage 102. The second stage 102 may be implemented as a pair of transistors (e.g., a transistor M1 and a transistor Q2). The transistors M1 and the transistor Q2 may be configured in a low voltage Darlington pair arrangement. The transistor M1 may be implemented as a field effect (FET) transistor. The transistor Q2 may be implemented as a bi-polar junction (BJT) transistor.

In one example, the transistor M1 may be implemented as an NMOS input transistor having a zero (or near zero) voltage threshold (Vt). For example, the threshold voltage of the transistor M1 may be less than 100-200 mV. Such a zero-Vt FET is a specialized device option that is available in certain manufacturing topologies. For example, the 7WL SiGe BiC- MOS process technology available from IBM™ offers a zero threshold FET. Such a zero threshold FET, when implemented in the context of the present invention, may provide a low power, low noise operation.

In the topology of the circuit 100, the zero-Vt FET transistor M1 enables roughly 1 VBE (base to emitter voltage) of input voltage to the Darlington pair 102. Such an input voltage lowers the operating voltage needed to run the Darlington pair 102 by 1 VBE.

While a zero-Vt FET has been described, a depletion mode FET may also be implemented. A depletion mode device may result in an input Darlington voltage of less than 1 VBE. However, the FET threshold characteristics should normally allow a roughly 1 VBE Darlington input voltage at the gate in order to ensure headroom in the collector to emitter voltage (VCE) about the first stage transistor Q1. Such headroom may be implemented in order to preserve radio frequency (RF) performance parameters such as gain, noise figure and linearity provided by the directly coupled common-emitter input stage transistor Q1. While a depletion mode FET may be implemented for the transistor M1, such an implementation may result in less than 1 VBE at the input of the Darlington and across the RF input transistor Q1, which is normally less desirable to RF performance of the transistor Q1. The use of a standard NMOSFET for the transistor M1 (with typical threshold of ~0.7 v) would result in a specification for a higher DC input voltage of the Darlington, such as ~2 VBE-100 mV. While a standard NMOSFET may not provide the desired RF performance, a zero-VT or near zero-VT device may be optimal for providing wide-band RF performance under a reduced supply voltage for the given two-stage topology of the circuit 100.

The use of a MOSFET device for the transistor M1 at the input of the Darlington operates as a unit gain follower. The transistor M1 has a minimal impact on RF performance compared to the use of a bipolar transistor or compared to an NMOS device. The RF performance of the amplifier (e.g., noise, linearity, bandwidth, etc.) is primarily determined by the common-emitter bipolar transistors Q1 and Q2 of the topology. Another inherent advantage of employing bipolar transistors for the common-emitter input and output stages is that the gate of the MOSFET transistor M1 may be isolated from the input. Such isolation helps protect the transistor M1 from destructive electrostatic (ESD) events.

The circuit 100 also includes a first feedback resistor (e.g., RFB1). The resistor RFB1 may be used to set the DC bias of the bipolar transistors Q1 and Q2. The resistor RFB1 may also be used to tune the RF performance of the circuit 100.

Since the circuit 100 implements a low voltage Darlington, the circuit 100 may operate using a minimum practical supply voltage VCC as low as 1 VBE+200 mV or ~1 v. The specific supply voltage VCC is normally dependent on the application. The supply voltage VCC may be defined as VCC=VBE+IC1*RFB1. For a low voltage GPS LNA implementation, the supply voltage VCC may be as low as 1.2-1.5 times VBE, or a supply of 1-1.2V. The circuit 100 may operate in a typical 1.8V battery operated system.

The circuit 100 may also include a second feedback resistor (e.g., RFB2). The resistor RFB2 may be adjusted to optimize broadband RF performance. A resistor (e.g., RBIAS) may be used to set the quiescent bias current of the FET transistor M1. An output inductor (e.g., L2) may also be employed. The inductor L2 has a first side connected to a ground bond from an integrated circuit pad (e.g., GP2) and a second side connected to a common ground. The inductor L2 may be used to tune the output return-loss. The inductor L2 may typically be minimized to improve high frequency performance. The inductors L1 and L2 also may represent physical and finite ground inductance realized by the parasitic inductance of the down-bonds. The circuit 100 may maintain broadband RF performance while allowing low voltage supply operation typically characteristic of CMOS integrated circuits.

Figure 2:
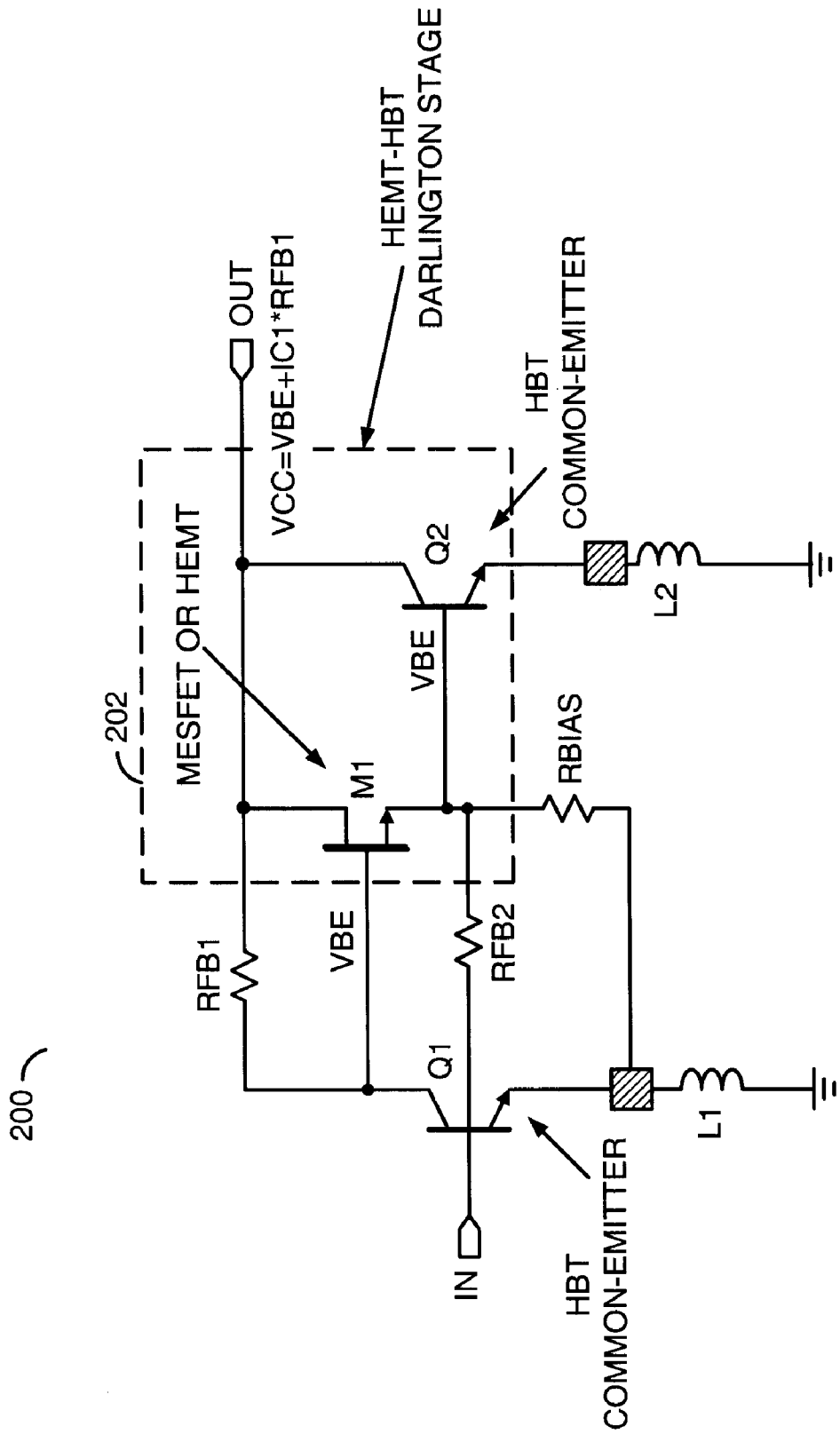
FIG. 2 is a diagram of an implementation of an alternate embodiment of the present invention.

Referring to FIG. 2, a circuit 200 is shown illustrating a more detailed embodiment of the present invention. The circuit 200 may employ a MOSFET (or HEMT) transistor for the transistor M1. The circuit 200 may be implemented where the monolithic integration of (i) MESFET and HBT or (ii) HEMT and HBT devices is practical. Modern fabrication techniques allow the integration of both FET and HBT devices on the same compound semiconductor technology such as InP, GaAs and GaN. Such devices may be formed according to technologies found in U.S. Pat. No. 6,465,289 (Method of Fabricating Monolithic Multifunction Integrated Circuit Devices), U.S. Pat. No. 7,015,519 (Structures and Methods for Fabricating Vertically Integrated HBT/FET Device), U.S. Pat. No. 6,906,359 (BiFET Including a FET Having Increased Linearity and Manufacturability), and U.S. Pat. No. 5,250,826 (Planar HBT-FET Device), each of which is incorporated by reference.

The present invention may have an even more dramatic benefit for GaAs HBT semiconductors. In such implementations, the bipolar HBT device normally has a turn-on voltage of nearly twice that of a silicon BJT transistor and SiGe HBT transistors when implemented in a silicon BiCMOS technology. GaAs HBT devices have turn-on voltages of ~1.4V compared to 0.8V for SiGe HBT devices. With conventional approaches, the base terminal of a Darlington pair of transistors is 2 VBE=2.8V with an additional voltage drop across a feedback transistor in order to set the DC bias. For robust bias operation, the voltage drop across the resistor RB1 may be roughly 0.5V or greater. A minimum robust supply voltage for an all-GaAs HBT direct-coupled two stage design would be VCC=2 VBE+Ic1*RFB1=2*1.4V+0.5V=3.3V. An all-GaAs HBT design precludes supply operations below 3.3V. However, when implementing a HEMT or a MESFET device with appropriate threshold characteristics, the input gate voltage of the Darlington output stage of the circuit 200 may be set to roughly 1 VBE.

Such an operating voltage may be achieved using a depletion-mode GaAs MESFET or a HEMT transistor having a pinch off voltage that may range from zero to a negative voltage. If a MESFET or HEMT transistor had a zero threshold voltage, a gate voltage of 1 VBE would result as shown in the circuit 200. For example, a gate voltage of 1 VBE for the gate of the Darlington normally results in a 1.4V collector to emitter VCE for the common-emitter low noise input stage comprised of the HBT transistor Q1. This is roughly the minimum collector to emitter voltage VCE needed for operating the transistor Q1 as a sufficient low noise amplifier stage. However, the first stage amplifier may operate as low as 1V and still maintain reasonable RF performance, but with some degradation to noise and linearity. If the MESFET or HEMT is implemented as a depletion mode device having a pinch off voltage that is negative, the device periphery may be adjusted such that a gate to source voltage VGS of 0V would result in the desired bias current through the MOSFET source and through the series bias resistor RBIAS. The bias current is typically determined by the current IDSS specification of a depletion mode GaAs MESFET or HEMT device. The current IDSS is the current through the device with a VGS=0V. The result would be a gate voltage at the input of the Darlington output stage of 1 VBE~1.4V since the gate to source voltage VGS would equal zero.

In the two case above, the minimum robust supply voltage would be VCC=VGS+VBE+Ic1*RFB1. Numerically, this would be VCC=0V+1.4V+0.5V=1.9V which is much lower than the 3.3V minimum robust supply needed for an all-GaAs HBT case. To operate at 1.8V, the periphery (or gate width) of the MESFET or HEMT transistor M1 may be adjusted. Such an adjustment would achieve the desired source current for a VGS<0V. For example, if a periphery was selected to achieve a desired design source current for a VGS=−0.2V, then the minimum robust supply voltage would be VCC=−0.2V+ 1.4V+0.5V=1.7V. The input gate of the Darlington would be 1 VBE-0.2V or 1.2V, which would also be the corresponding collector to emitter voltage VCE voltage for the common-emitter input stage. Such a collector to emitter voltage VCE would normally be adequate for operating the first stage as a low noise common-emitter amplifier. For GaAs FET-HBT implementation, the 2-stage directly coupled topology would enable a robust lower voltage operation than would be achieved from an all-HBT design.

Figure 3:
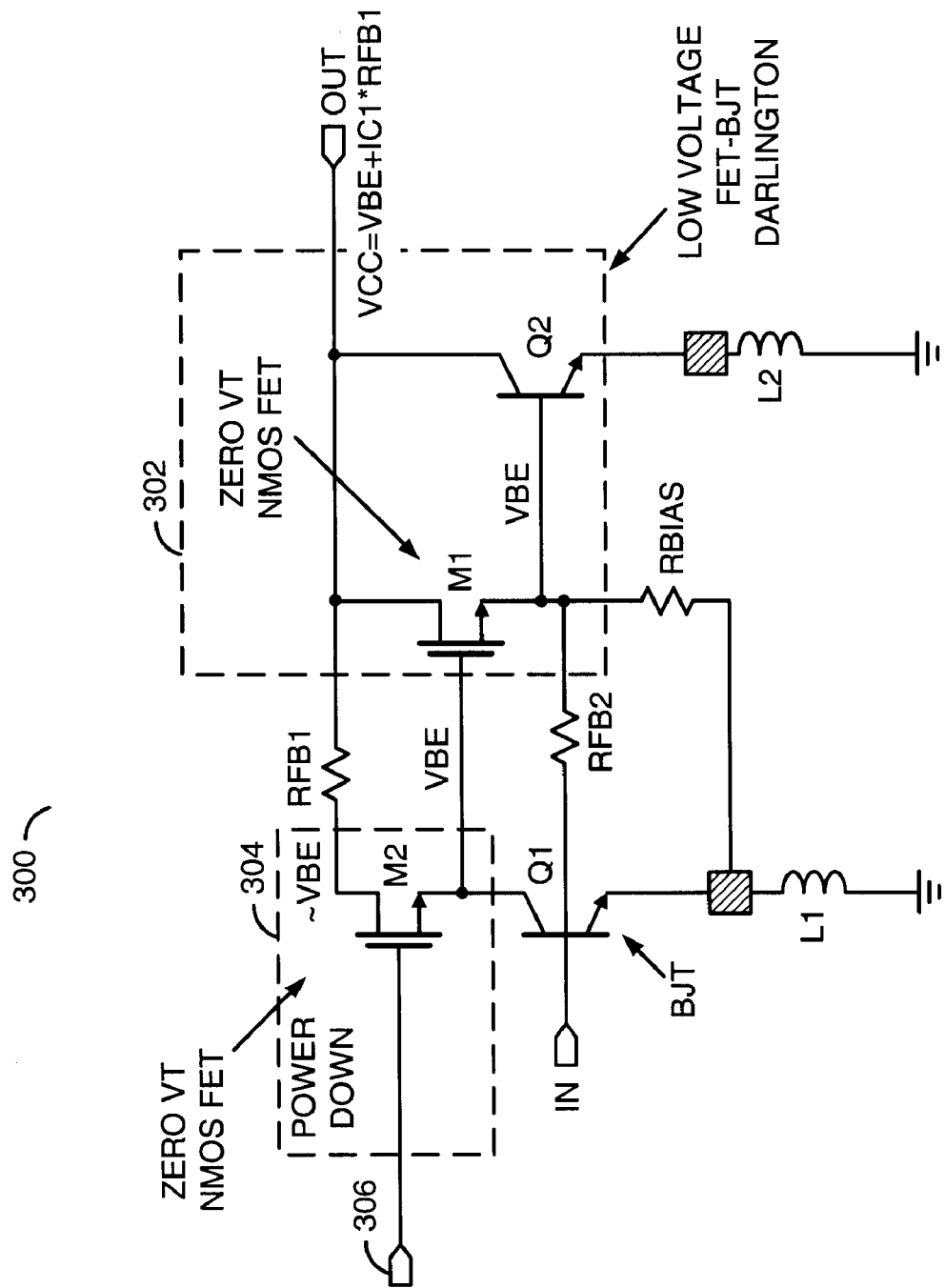
FIG. 3 is a diagram of implementation of another alternate embodiment of the present invention.

Referring to FIG. 3, a circuit 300 is shown illustrating another embodiment of the present invention. The circuit 300 employs a low voltage power down portion 304. The power down portion 304 generally comprises a zero threshold NMOS FET transistor M2. The transistor M2 may be integrated into the parallel feedback path of the circuit 300. By implementing a second near-zero threshold FET transistor M2 in series with the RF feedback resistor RFB1, a power down capability (a mode) may be enabled and optimized for low voltage operation.

When the voltage on a power down pin 302 is pulled up to VCC (e.g., 1.8V for a 1.8V design), the FET transistor M2 is turned-on and allows current to flow through the resistor RFB1 which sets the bias of the circuit 300. Such conduction is defined as an enable state. When the transistor M2 is conducting and operating as a switch with low on-resistance, the DC voltage drop from drain to source is small (e.g., less than 100 mV). By pulling the power down voltage down to 0V, the FET transistor M2 becomes open and pinches off the bias current set through the resistor RFB1. This disables the amplifier which will possess a leakage current typically less than 1 μA of current. The power down threshold voltage may be set to approximately VPD_THRESHOLD~VGS2+ VGS1+VBE~0.8V. The power down threshold is approximately half of the supply voltage VCC, which is nearly optimal.

The use of the zero threshold FET transistor M2 allows a more optimal power down threshold compared to a conventional NMOS FET which would result in a VPD_THRESHOLD of ~0.7V+0V+0.8V~1.5V. The present invention normally provides a margin if a supply voltage has degraded due to weak battery operation. The circuit 300 also applies to a GaAs FET-HBT semiconductor implementation where a depletion mode FET with optimized characteristics (e.g., optimizing device periphery through adjustment of a gate width device periphery) in the transistor M1 and/or the transistor M2 to achieve low voltage supply operation.

Figure 4:
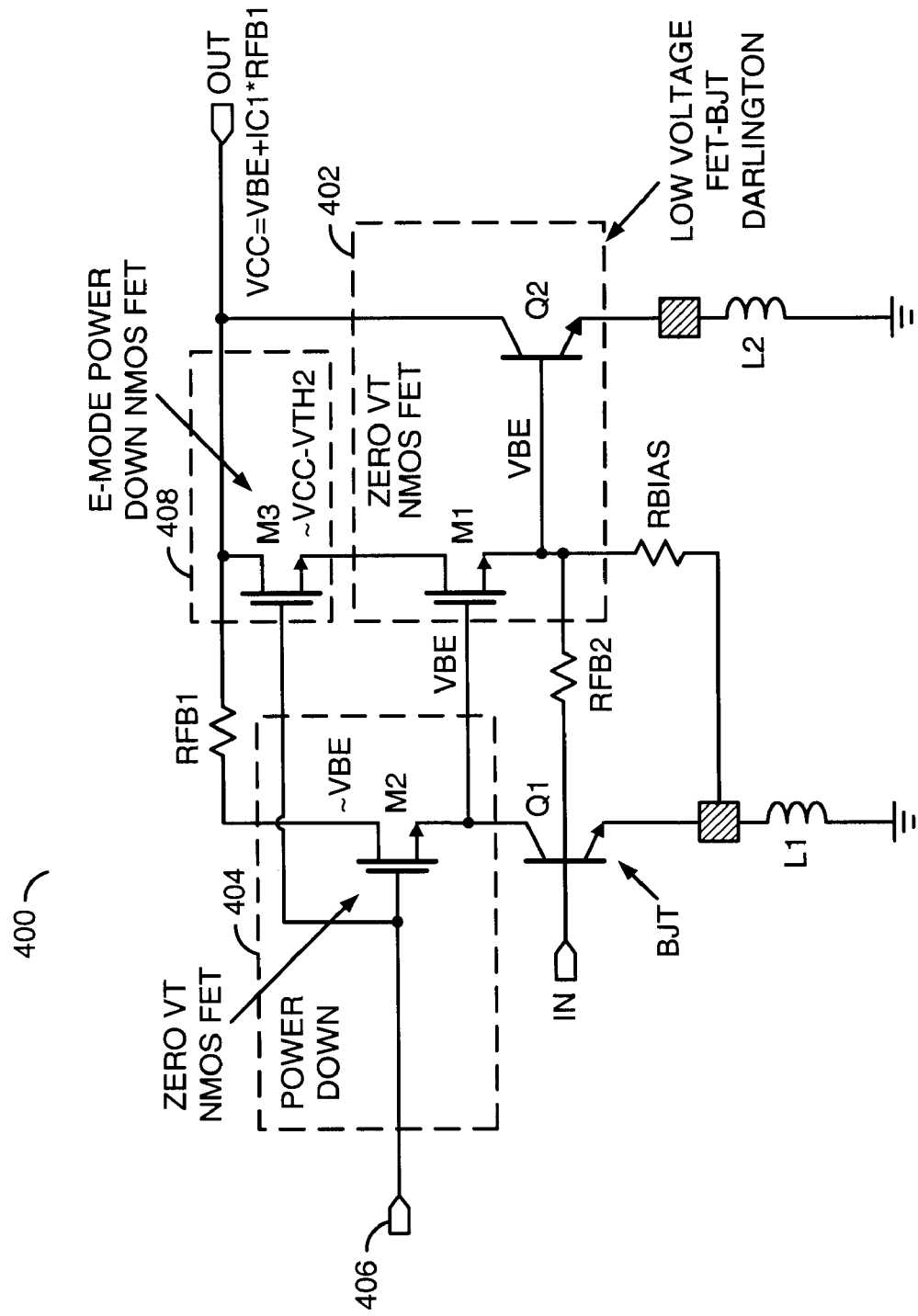
FIG. 4 is a diagram of implementation of another alternate embodiment of the present invention.

Referring to FIG. 4, a diagram of a circuit 400 is shown illustrating another embodiment of the present invention. The circuit 400 provides a slight modification to the circuit 300. The circuit 400 may further improve the power down idle current down to the nano-amp range when the circuit 400 is powered down or disabled when a high voltage supply voltage VCC is applied to the power down pin 400.

In addition, the RF performance of the circuit 400 may be enhanced when the circuit 400 is powered on or enabled. A power down section 408 may include a NMOS FET transistor M3. The transistor M3 may have a drain current in series with the drain current of NMOS FET transistor M1. The FET transistor M3 may ensure that no leakage current is running through the transistor M1 in the power down state. The transistor M3 may also prevent the zero Vt NMOS transistor M1 from conducting due to a floating non-zero voltage on the gate of the transistor M1 when the power down pin 406 is pulled down to zero. For a BiCMOS implementation, the NMOS FET transistor M3 may preferably be implemented as an enhancement mode device with finite positive turn-on threshold voltage. A typical threshold voltage of the transistor M3 may range from 0.1 to 0.9V, the typical range found for NMOS transistors.

By using an E-mode (enhancement mode) transistor M3 with positive turn-on threshold, a zero voltage applied to the power down pin 406 (and hence the gate of the transistor M3) will normally switch off the transistor M3, preventing conduction in the disabled state. Optimally, the geometry of the transistor M3 may be chosen for a given drain current such that the voltage produced at the source of the transistor M3 allows enough voltage headroom VDS1 for wide-band RF characteristics when the circuit 400 is enabled (e.g., when the power down pin 406 is pulled up to the supply voltage VCC). In the enabled state, the transistor M1 may operate in the saturation region where VDS1>VGS−VTH, resulting in wide-band RF performance. Such performance may be optimized by choosing the correct periphery of the E-mode transistor M3. In addition, the transistor M3 will normally function as a cascode transistor which may improve the bandwidth characteristics of the circuit 400 by reducing the Miller effect and increasing output impedance.

The circuit 400 may be particularly applicable to other technologies such as InP or GaAs BiFET technology. In such implementations, the BJT may be replaced by an HBT device, the zero VT NMOS FET may be replaced by a depletion mode PHEMT or MESFET device, and the E-mode power down NMOS device M3 may be replaced by an E-mode PHEMT or MESFET device.

Figure 5:
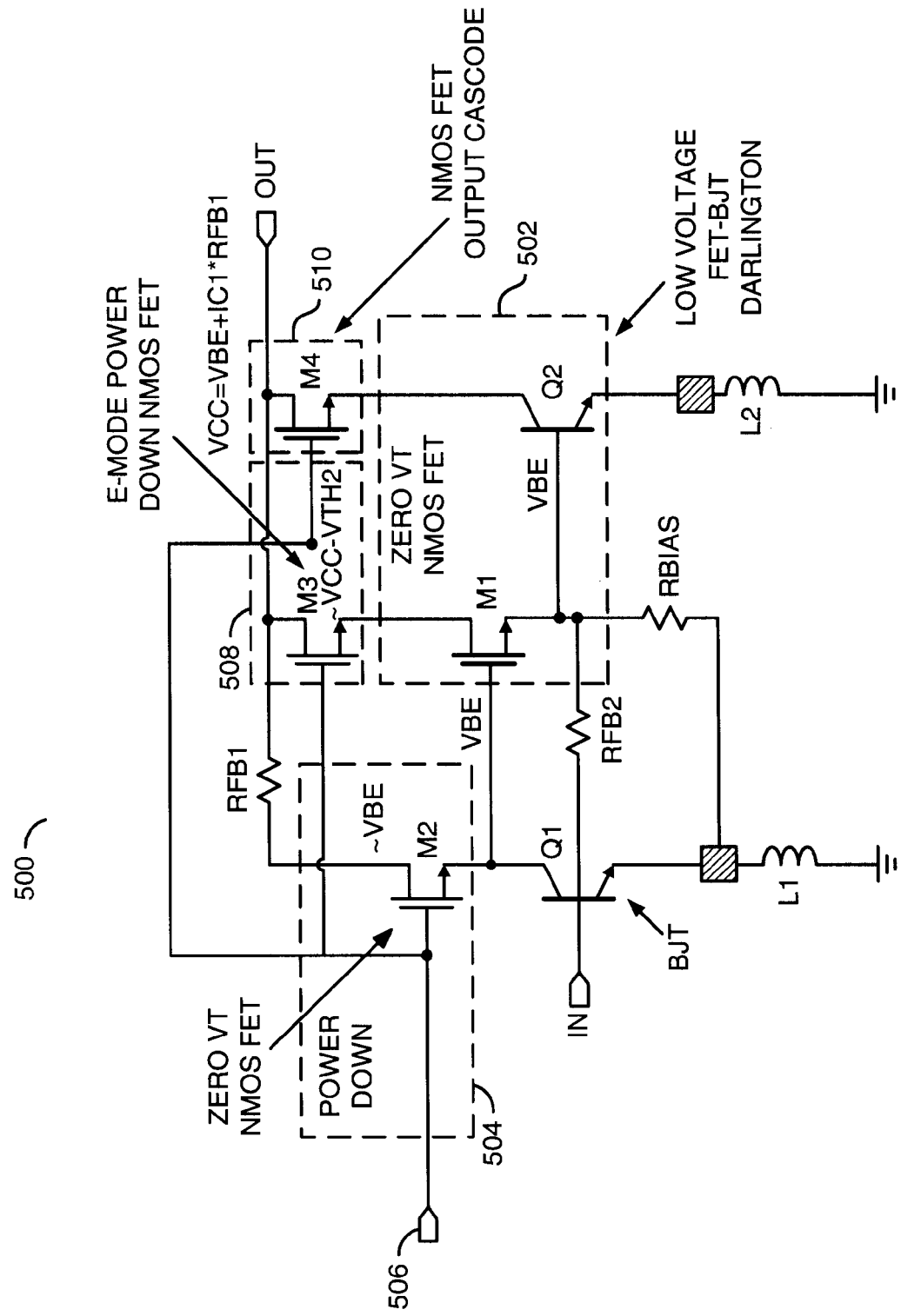
FIG. 5 is a diagram of implementation of another alternate embodiment of the present invention.

Referring to FIG. 5, a circuit 500 is shown illustrating another embodiment of the invention. The circuit 500 implements a slight modification to the circuit 400. The circuit 500 may improve the power down idle current when the circuit 500 is powered down or disabled when a low potential close to zero is applied to the power down pin 506. In addition, the RF performance of the circuit 500 may be enhanced when powered on or enabled.

In the circuit 500, a power down section 510 implemented as an NMOS FET transistor M4 is added. The transistor M4 has a drain current is in series with the drain current of the bipolar transistor Q2. The FET transistor M4 may ensure that no leakage current is running through the transistor Q2 in the power down state. The transistor M4 prevents the bipolar transistor Q2 from conducting, due to a floating non-zero voltage on the base of the transistor Q2 when the power down pin 506 is pulled down to zero. In addition, when the power down pin 506 is pulled up high to the supply voltage VCC and the circuit 500 is enabled, the transistor M4 may function as a cascode. The transistor M4 may reduce the Miller effect on the transistor Q2, reduce the self-heating of the transistor Q2, and/or increase the output impedance, all of which may improve the electrical and thermal performance of the circuit 500. In the circuit 500, the size, threshold voltage nature, and general configuration of the transistor M4 may be chosen to optimize both power down and RF performance of the circuit 500 using either a E-mode or a D-mode (depletion mode) transistor. The circuit 500 is also not restricted to BiCMOS technology and is applicable to GaAs or InP BiFET technology.

Figure 6:
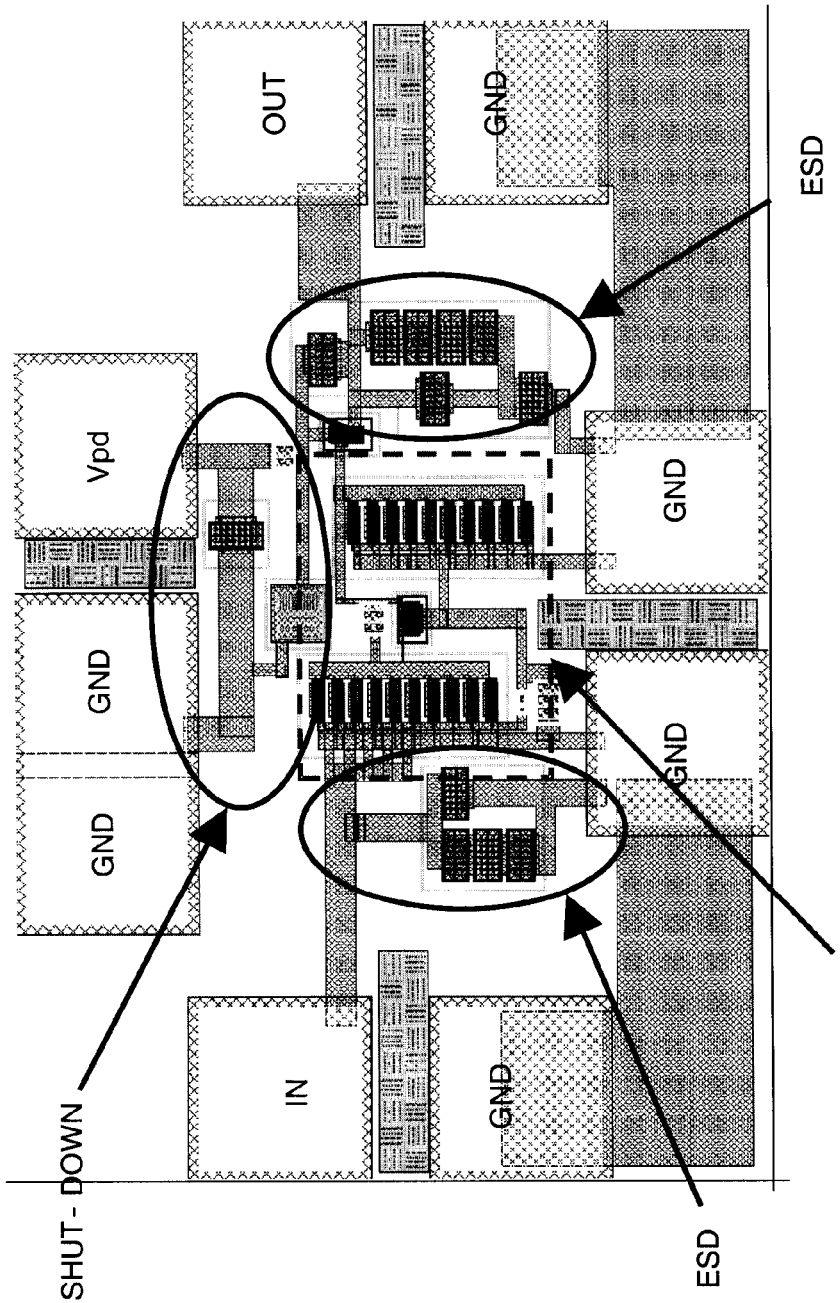
FIG. 6 is a diagram of an integrated circuit layout of an implementation of the present invention.

Referring to FIG. 6, an integrated circuit layout of a 1.8V GPS LNA design is shown. The design enables broadband, low noise, and high gain performance in a compact size. A typically conventional two stage RF amplifier operating from a low supply would integrate many passive inductors and capacitors and consume as much as 10 times the area of the circuits 100, 200, 300, 400 and 500. The layout of the present invention may be roughly 0.7×0.5 mm². However, the core of the 2-stage LNA may only need 0.15×0.2 mm² of area, excluding bondpads, ESD, and shut down circuitry.

The small implementation size of the present invention is attractive when integrating with higher complexity multifunctional integrated circuits. In addition, a traditional passively matched RF amplifier may be limited to a narrower frequency band of operation of a few hundred MHz. This is small compared to the multi-decade performance capability of the present invention, which may address multi-band, multi-mode applications such as WiMAX. The topology of the present invention may be implemented in a variety of technologies. In one implementation, a 1.8V the 7WL 0.18 um SiGe BiCMOS technology by IBM™ may be used.

Figure 7:
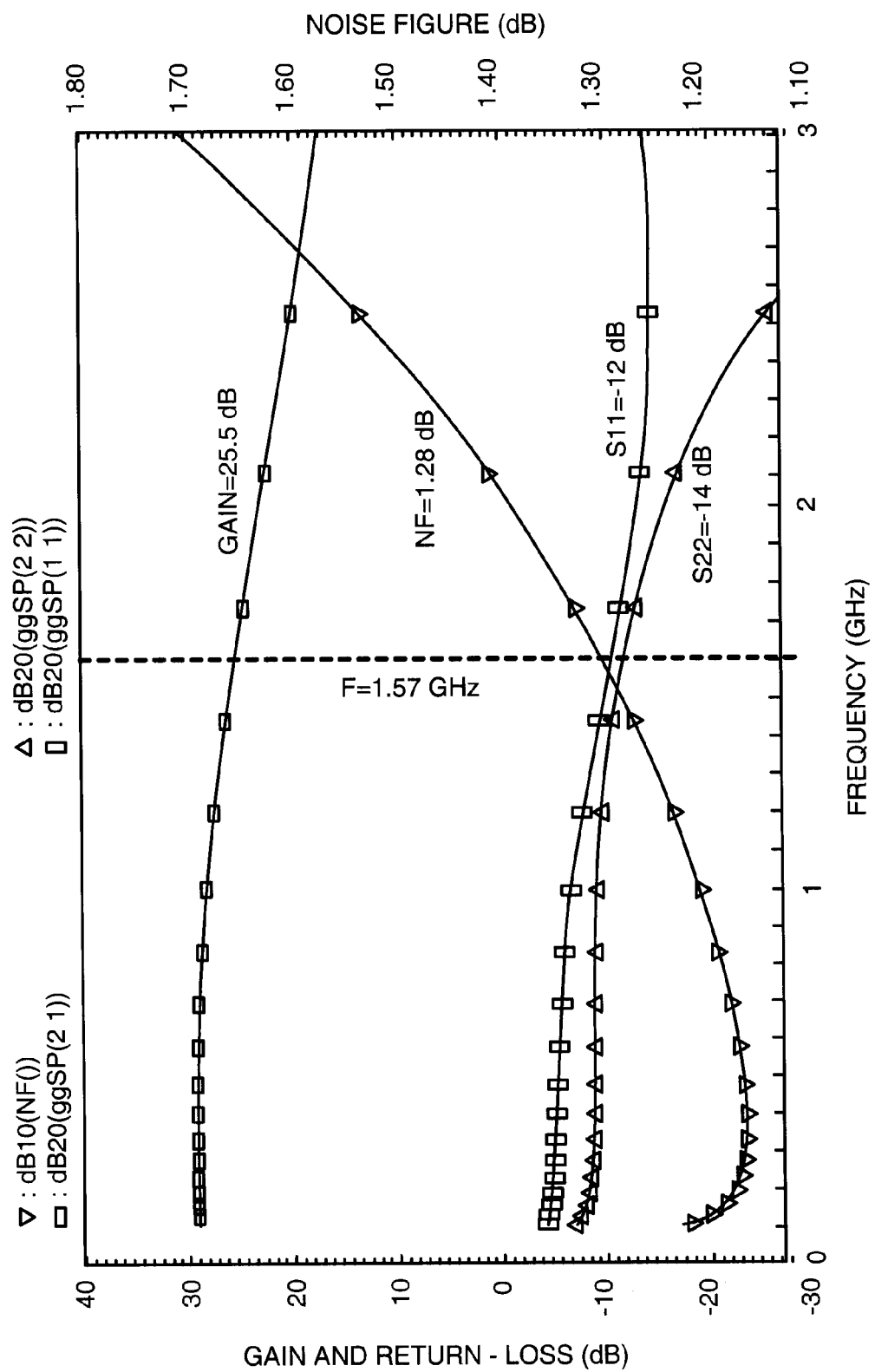
FIG. 7 is a graph illustrating an exemplary illustration of the performance of an implementation of the present invention.

Referring to FIG. 7, a graph illustrating an exemplary illustration of the performance of the compact low voltage LNA of the present invention is shown. The present invention exhibits wide band gain beyond 3 GHz with low frequency gain down to DC. The invention illustrates multi-decade frequency capability. At the GPS design frequency of 1.57 GHz, the present invention achieves a 25.5 dB gain and a noise figure of 1.28 dB. The noise figure and gain performance includes the parasitic effects of the package and ESD protection circuitry. At the normal GPS frequency, the input return-loss is −12 dB and the output return-loss is −14 dB. The P1dB is 0 dBm which is understandably lower than a 3V design. The high gain and low noise performance of a high speed Bipolar technology may be achieved while operating under low voltage operation of 1.8V.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
    a first stage comprising a first transistor configured as a common-emitter amplifier;
    a second stage comprising a second and third transistor configured as a low voltage Darlington transistor pair, wherein (i) said first stage is directly coupled to said second stage, (ii)
said second transistor comprises a field effect (FET) input transistor, and (iii) said third transistor comprises a bipolar output transistor; and
    a feedback resistor coupled between a base of said common-emitter amplifier and a source of said FET input transistor.

2. The apparatus according to claim 1, wherein said first transistor comprises a bipolar transistor.

3. The apparatus according to claim 1, wherein said apparatus comprises a 2-stage RF amplifier operating from DC to microwave frequencies.

4. The apparatus according to claim 1, wherein said FET input transistor is configured to provide a near zero gate to source voltage during DC operation.

5. An apparatus comprising:
    a first stage comprising a first transistor configured as a common-emitter amplifier;
    a second stage comprising a second and third transistor configured as a low voltage Darlington transistor pair, wherein (i) said first stage is directly coupled to said second stage, (ii)
said second transistor comprises a field effect (FET) input transistor, and (iii) said third transistor comprises a bipolar output transistor; and
    an inductor coupled to an emitter of said third transistor, wherein said FET input transistor is configured to provide a gate to source voltage of less than 200 mV during DC operation.

6. The apparatus according to claim 1, wherein said FET input transistor comprises a zero-threshold MOSFET transistor configured to provide zero or near-zero gate to source voltage operating characteristics.

7. The apparatus according to claim 1, wherein said FET input transistor comprises a depletion mode MESFET or HEMT device for providing zero or near-zero gate to source voltage operating characteristics.

8. The apparatus according to claim 1, further comprising:
    a feedback resistor coupled from a collector of the common-emitter input stage to a drain of the FET input transistor of the low voltage Darlington transistor pair.

9. An apparatus comprising:
    a first stage comprising a first transistor configured as a common-emitter amplifier;
    a second stage comprising a second and third transistor configured as a low voltage Darlington transistor pair, wherein (i) said first stage is directly coupled to said second stage, (ii)
said second transistor comprises a field effect (FET) input transistor, and (iii) said third transistor comprises a bipolar output transistor; and
    an inductor (i) coupled to an emitter of said first stage and (ii) configured to provide low noise matching.

10. The apparatus according to claim 1, wherein said apparatus is configured to operate using a supply voltage as low as a base to emitter voltage of the FET input transistor.

11. The apparatus according to claim 1, wherein said apparatus is configured to achieve low broadband noise.

12. The apparatus according to claim 1, wherein said amplifier is fabricated using BiCMOS technology.

13. The apparatus according to claim 1, wherein said amplifier is fabricated using FET-HBT compound semiconductor technology.

14. The apparatus according to claim 1, wherein said apparatus is monolithically integrated.

15. The apparatus according to claim 1, wherein said amplifier employs a feedback field effect transistor (FET) (i) in series with a collector of the common-emitter bipolar transistor and (ii) configured to provide power down control.

16. The apparatus according to claim 15, wherein said feedback FET comprises a zero or near-zero threshold FET configured to provide an amplifier power down.

17. The apparatus according to claim 15, wherein said feedback FET comprises a depletion mode HEMT device.

18. The apparatus according to claim 15, wherein said FET transistors and Bipolar transistors are fabricated using GaAs or other III-V compound semiconductor technology.

19. The apparatus according to claim 18, further comprising:
    an E-mode FET configured (i) in series with a drain of first said FET input transistor and (ii) to provide power down control.

20. The apparatus according to claim 1, further comprising:
    an FET transistor configured (i) in series with a collector of the third transistor and (ii) to provide one or more of power down control and enhanced RF and thermal performance.

21. The apparatus according to claim 1, further comprising:
    an inductor (i) coupled to an emitter of the first stage and (ii) configured to provide low noise matching.

* * * * *